(12) United States Patent
Suganuma

(10) Patent No.: US 6,229,386 B1
(45) Date of Patent: May 8, 2001

(54) DIGITAL FM DEMODULATION CIRCUIT

(75) Inventor: Hisashi Suganuma, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/258,137

(22) Filed: Feb. 26, 1999

(30) Foreign Application Priority Data

Mar. 2, 1998 (JP) ................................. 10-066261

(51) Int. Cl.[7] ................................. H03D 3/00; H03D 3/02
(52) U.S. Cl. ................. 329/341; 329/336; 375/324; 455/214
(58) Field of Search ................................. 329/341, 336, 329/315, 343; 375/324, 322; 455/214, 337, 216; 327/106

(56) References Cited

U.S. PATENT DOCUMENTS

| | | |
|---|---|---|
| 4,470,147 | 9/1984 | Goatcher . |
| 4,560,941 | 12/1985 | Welles, II et al. . |
| 4,875,017 | 10/1989 | Sakazaki ................................. 329/336 |
| 5,848,739 | * 4/1999 | Doi ................................. 375/341 |

FOREIGN PATENT DOCUMENTS

| | | | |
|---|---|---|---|
| 0 526 747 | 2/1993 | (EP) | ................................. G06F/1/035 |
| 2 113 930 | 8/1983 | (GB) | ................................. H03D/3/00 |

* cited by examiner

*Primary Examiner*—Arnold Kinkead
(74) *Attorney, Agent, or Firm*—Sughrue, Mion, Zinn, Macpeak & Seas, PLLC

(57) ABSTRACT

A digital FM demodulation circuit which samples an input analog FM signal and digitally detects the sampled input signal has an arctangent circuit into which a second signal that is delayed from the sampled input signal by a constant time, and a third signal that is different in phase by 90 degrees from the second signal are input, and which outputs a corresponding arctangent value based on a result of a division of the two input signals. The arctangent circuit has: roundoff means for sequentially rounding the division result to one of plural typical values; and a ROM address unit for performing a control in which an arctangent value corresponding to the rounded typical value is selected from a ROM table containing arctangent values of the typical values, and the selected arctangent value is output.

3 Claims, 3 Drawing Sheets

DIGITAL FM DEMODULATION CIRCUIT

BACKGROUND OF THE INVENTION

1. Field of the Invention

The present invention relates to a digital FM demodulation circuit which uses an arctangent circuit having ROM tables.

2. Description of the Related Art

FIG. 1 is a schematic block diagram showing a conventional digital FM demodulation circuit. The digital FM demodulation circuit includes delay circuits 1, 2, and 6, adders 3 and 7, a divider 4, and an arctangent circuit 5. The operation of the digital FM demodulation circuit will be described. In the demodulation circuit, there is inputted a digital FM signal into which an analog FM signal is converted with a sampling frequency that is four times higher than a frequency of the analog signal.

When the sampling frequency is set to be four times as large as the frequency of the original signal, it is possible to set a phase difference between the sampling frequency and an non-modulated digital FM signal at 90 degrees. Each time when a digital FM signal is passed through a delay circuit, the phase of the signal is delayed at 90 degrees. The sampled digital FM signal passes through a delay circuit 1 to be converted to a second signal that is delayed for a constant time. The second signal is referred to as $\sin\omega t$.

On the other hand, the sampled digital FM signal is converted also to a third signal which is always phase-shifted at 90 degrees with respect to the second signal, by a Hilbert conversion circuit including the delay circuits 1 and 2, the adder 3, and the divider 4. The third signal is referred to as $\cos\omega t$. A FM signal C which is phase-shifted by 90 degrees, i.e., $\cos\omega t$, and A FM signal S which is not phase-shifted, i.e., $\sin\omega t$ are inputted to the arctangent circuit 5. The arctangent circuit 5 performs a division of the two signals to obtain $\tan\omega t$ ($=S/C=\sin\omega t/\cos\omega t$), and obtains arctan(S/C) from ROM tables. As a result, a phase $\omega$ of the FM signal is detected.

An output of the arctangent circuit 5 is delayed for one sampling period by the delay circuit 6, and then inverted by an inverting circuit which is not shown. The inverted output is supplied to one input of the adder 7. On the other hand, to the other input of the adder 7, the output of the arctangent circuit 5 is directly inputted. In the adder 7, the two inputs are added to each other, so that a FM detector output as a demodulated signal is obtained.

As described above, a general digital FM demodulation circuit requires an arctangent circuit in which the phase of a sampled signal is calculated from the amplitude of the signal. Usually, it is often that such a calculation circuit itself is not configured and the phase is obtained by using ROM tables corresponding to an input value.

In most of A/D converter circuits, the output digital value is expressed by one bit in code information and n bits in amplitude information. In the following description, therefore, a 4-bit A/D converter in which code information consists of 1 bit and amplitude information of 3 bits is used as an example, and it is assumed that an analog FM signal is converted to a digital FM signal by the A/D converter and the digital FM signal is inputted to a digital FM demodulation circuit. In the 4-bit A/D converter, the amplitude of the input signal is expressed by one of digital values of 15 kinds from −7 to 7. Consequently, each of the above-mentioned S and C can have one of the values from −7 to 7, and 113 ROM tables of arctangents of S/C are necessary (when S/C≧0, 64 ROM tables, and when S/C<0, 49 ROM tables). When no countermeasure is taken, therefore, there arises a problem in that the cost of preparing ROM tables is too high.

SUMMARY OF THE INVENTION

In view of the problem, it is an object of the invention to reduce the number of ROM tables used in an arctangent circuit without lowering the performance.

According to the present invention, there is provided a digital FM demodulation circuit sampling an input analog FM signal and digitally detecting the sampled input signal, comprising:

an arctangent circuit into which a second signal that is delayed from the sampled input signal for a constant time and a third signal that is different in phase at 90 degrees from the second signal are inputted, and which outputs a corresponding arctangent value based on a result of a division of the two input signals, and the arctangent circuit including:
roundoff means for sequentially rounding the division result to one of a plurality of typical values; and
ROM address unit for selecting an arctangent value corresponding to the rounded typical value from a ROM table containing typical arctangent values, and outputting the selected arctangent value.

According to the present invention, the arctangent circuit may further comprise:

polarity detection means for detecting whether the division result is a negative value; and a polarity correction unit which changes a polarity of the outputted arctangent value, and wherein if the polarity detection unit judges that the division result is a negative value, the polarity correction unit changes the polarity of the output arctangent value to negative.

According to the present invention, the arctangent circuit may further comprise:

a level comparison unit comparing a level of the second signal with a level of the third signal;

an exchange unit exchanging the second signal with the third signal; and a correction unit correcting the arctangent value, wherein if the level comparison unit judges that the second signal is larger in level than the third signal, the exchange unit exchanges the second signal with the third signal, and selects a corresponding arctangent value from the ROM table based on the exchanged value, and the correction unit corrects the arctangent value outputted from the ROM table to the arctangent value to be obtained in the case where the second signal is not exchanged with the third signal.

DETAILED DESCRIPTION OF THE PRESENT INVENTION

Hereinafter, embodiments of the invention will be given with reference to the accompanying drawings. First, three techniques which are employed in the present invention will be described.

(First Method)

Figure 2:
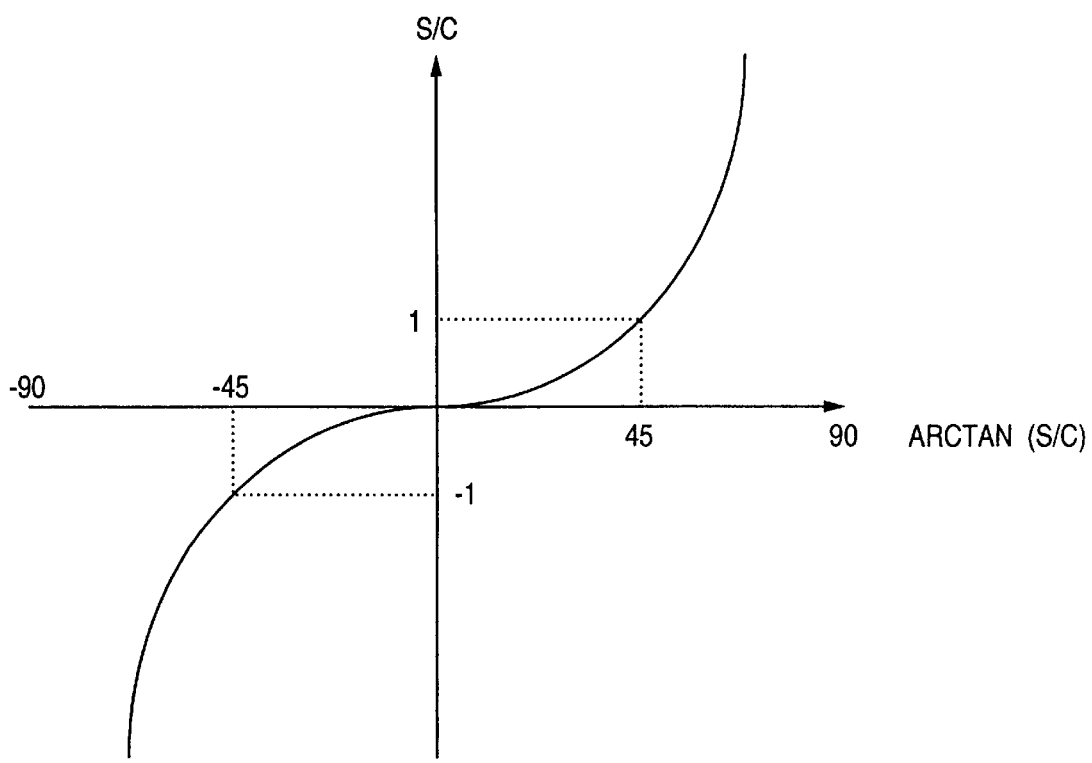
FIG. 2 is a view showing relationships between S/C and its arctangent.

FIG. 2 is a graph showing relationships between tanω (=S/C) and arctan(S/C). As shown in FIG. 2, the graph is symmetric with its origin. When S/C is negative, therefore, the angle value arctan(S/C) can be expressed by adding the sign "−" to the angle value which is to be obtained in the case where S/C is positive. When this technique is employed, the number of ROM tables can be reduced to half.

(Second Method)

Table 1 shows values of S/C in the case where S and C may be one of 0 to 7 (3 bits).

TABLE 1

| 7 | ∞ | 7 | 7/2 | 7/3 | 7/4 | 7/5 | 7/6 | 1 |
|---|---|---|-----|-----|-----|-----|-----|---|
| 6 | ∞ | 6 | 3 | 2 | 3/2 | 6/5 | 1 | 6/7 |
| 5 | ∞ | 5 | 5/2 | 5/3 | 5/4 | 1 | 5/6 | 5/7 |
| 4 | ∞ | 4 | 2 | 4/3 | 1 | 4/5 | 2/3 | 4/7 |
| 3 | ∞ | 3 | 3/2 | 1 | 3/4 | 3/5 | 1/2 | 3/7 |
| 2 | ∞ | 2 | 1 | 2/3 | 1/2 | 2/5 | 1/3 | 2/7 |
| 1 | ∞ | 1 | 1/2 | 4/3 | 1/4 | 1/5 | 1/6 | 1/7 |
| 0 |   | 0 | 0 | 0 | 0 | 0 | 0 | 0 |
| S |   |   |   |   |   |   |   |   |
| C | 0 | 1 | 2 | 3 | 4 | 5 | 6 | 7 |

As shown in Table 1, S/C, and C/S in which S and C are exchanged with each other exist in a symmetrical relationship about the axis of S=C, i.e., S/C=1. For S/C=1/2, for example, C/S =2/1 exists at the position which is symmetric with the axis of S/C=1. When these characteristics are used, it is possible to reduce the number of ROM tables. Specificially, when tanα=S/C, tanβ=C/S, and β=π/2−α, the following expression holds:

$$\tan^{-1}(C/S) = \pi/2 - \tan^{-1}(S/C) \quad (1)$$

From this expression, in the case where the arctangent is larger than 45 degrees in the case of S>C, $\tan^{-1}(S/C)$ can be obtained by using an angle in the case where the arctangent is smaller than 45 degrees in the case of S<C. By contrast, also the following expression may hold:

$$\tan^{-1}(S/C) = \pi/2 - \tan^{-1}(C/S) \quad (2)$$

From this expression, an angle in the case of S<C can be obtained by using an angle in the case of S>C.

Therefore, the number of ROM tables can be reduced to about half of that in the case of Table 1.

(Third method)

The applicant had an idea that the S/C axis of the graph of FIG. 2 is equally divided. When it is assumed that the above-described first technique is used, it is only required to consider the first quadrant of FIG. 2. As shown also in Table 1, infinite values exist in the range of S/C>1. Therefore, the S/C axis cannot be equally divided. Therefore, it is assumed that also the above-described second technique is further used. In this case, it is only required to consider the range of the arctangent value from 0 to 45 degrees. In this range (0≦S/C≦1), therefore, the S/C axis can be equally divided.

Table 2 below is a table where values of S/C which is not larger than 1 are arranged in ascending order.

TABLE 2

| Number | S | C | S/C | Arctan(S/C) (degree) | Phase difference from the previous phase (degree) |
|--------|---|---|-----|----------------------|---------------------------------------------------|
| 1 to 7 | 0 | 1 to 7 | 0 | 0 | |
| 8 | 1 | 7 | 1/7 | 8.13 | 8.13 |
| 9 | 1 | 6 | 1/6 | 9.46 | 1.33 |
| 10 | 1 | 5 | 1/5 | 11.31 | 1.85 |
| 11 | 1 | 4 | 1/4 | 14.04 | 2.73 |
| 12 | 2 | 7 | 2/7 | 15.95 | 1.91 |
| 13 | 1 | 3 | 1/3 | 18.43 | 2.48 |
| 14 | 2 | 6 | 2/6 | 18.43 | 0 |
| 15 | 2 | 5 | 2/5 | 21.80 | 3.37 |
| 16 | 3 | 7 | 3/7 | 23.20 | 1.40 |
| 17 | 1 | 2 | 1/2 | 26.57 | 3.37 |
| 18 | 2 | 4 | 2/4 | 26.57 | 0 |
| 19 | 3 | 6 | 3/6 | 26.57 | 0 |
| 20 | 4 | 7 | 4/7 | 29.74 | 3.17 |
| 21 | 3 | 5 | 3/5 | 30.96 | 1.22 |
| 22 | 2 | 3 | 2/3 | 33.69 | 2.73 |
| 23 | 4 | 6 | 4/6 | 33.69 | 0 |
| 24 | 5 | 7 | 5/7 | 35.54 | 1.85 |
| 25 | 3 | 4 | 3/4 | 36.87 | 1.33 |
| 26 | 4 | 5 | 4/5 | 38.67 | 1.80 |
| 27 | 5 | 6 | 5/6 | 39.81 | 1.14 |
| 28 | 6 | 7 | 6/7 | 40.60 | 0.79 |
| 29 to 35 | S | = C | 1 | 45.00 | 4.40 |
| 36 | 0 | 0 | | 0 or 45 | |

In Table 2, the column of "arctan(S/C)" shows the phase of an FM signal. This phase and a signal that is delayed by one sampling period by a delay circuit are used in a calculation in a subtracter, thereby producing an FM demodulation output. Therefore, each value of the column of "phase difference from the previous phase" in Table 2 indicates the digital roughness (resolution) of the output. As a result, 8.13 degrees (S/C=1/7) which is the maximum value in the phase differences in Table 2 is dominant over a SN ratio of the detector output. It may be determined that, when the S/C axis can be equally divided with presetting a division width of the S/C axis to 8.13 degrees or less, a large difference is not produced in the SN ratio.

Next, on this principle, S/C=1/7, 2/7, 3/7, 4/7, 5/7, 6/7, and 7/7 are extracted from Table 2 to produce Table 3 shown as follows.

TABLE 3

| S/C | Arctan(S/C) (degree) | Phase difference from the previous phase (degree) |
|-----|----------------------|---------------------------------------------------|
| 0 | 0 | |
| 1/7 | 8.13 | 8.13 |
| 2/7 | 15.97 | 7.82 |
| 3/7 | 23.20 | 7.25 |
| 4/7 | 29.74 | 6.54 |
| 5/7 | 35.54 | 5.80 |
| 6/7 | 40.60 | 5.06 |
| 1 | 45.00 | 4.40 |

As shown in Table 3, all the values of "phase difference from the previous phase" are equal to or less than 8.13 degrees. Even when the eight values of arctan(S/C) in Table 3 are used as typical values, therefore, a large difference is not produced in the SN ratio of the detector output.

More specifically, as shown in Table. 4, when the S/C axis is equally divided at a0 to a7 and the corresponding eight values of arctan(S/C) represent the range of 0 to 45 degrees, the number of ROM tables can be reduced without degrading the SN ratio.

TABLE 4

| S/C | Arctan(S/C) (degrees) |
|---|---|
| 0 · a0 < 1/14 | 0 |
| 1/7−1/14 · a1 < 1/7+1/14 | 8.13 |
| 2/7−1/14 · a2 < 2/7+1/14 | 15.95 |
| 3/7−1/14 · a3 < 3/7+1/14 | 23.20 |
| 4/7−1/14 · a4 < 4/7+1/14 | 29.74 |
| 5/7−1/14 · a5 < 5/7+1/14 | 35.54 |
| 6/7−1/14 · a6 < 6/7+1/14 | 40.60 |
| 7/7−1/14 · a7 < 7/7 | 45.00 |

When the above three techniques are employed, the number of ROM tables can be reduced to eight.

(First embodiment)

Figure 1:
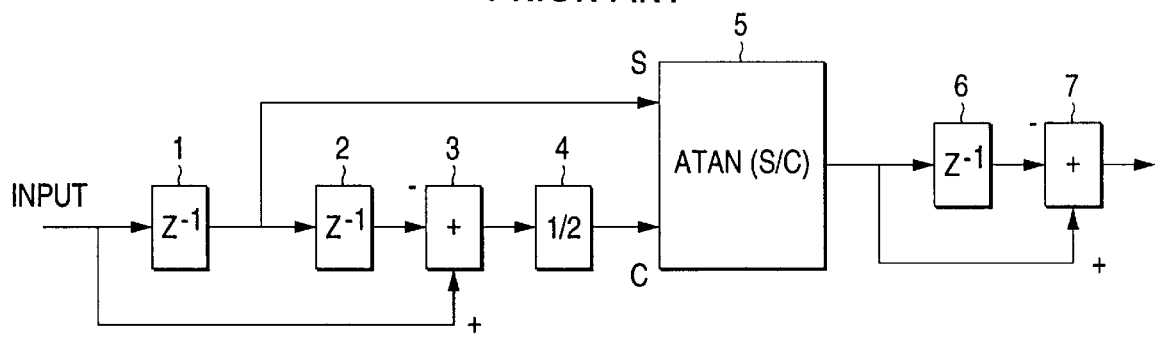
FIG. 1 is a schematic block diagram of a digital FM demodulation circuit.
Figure 3:
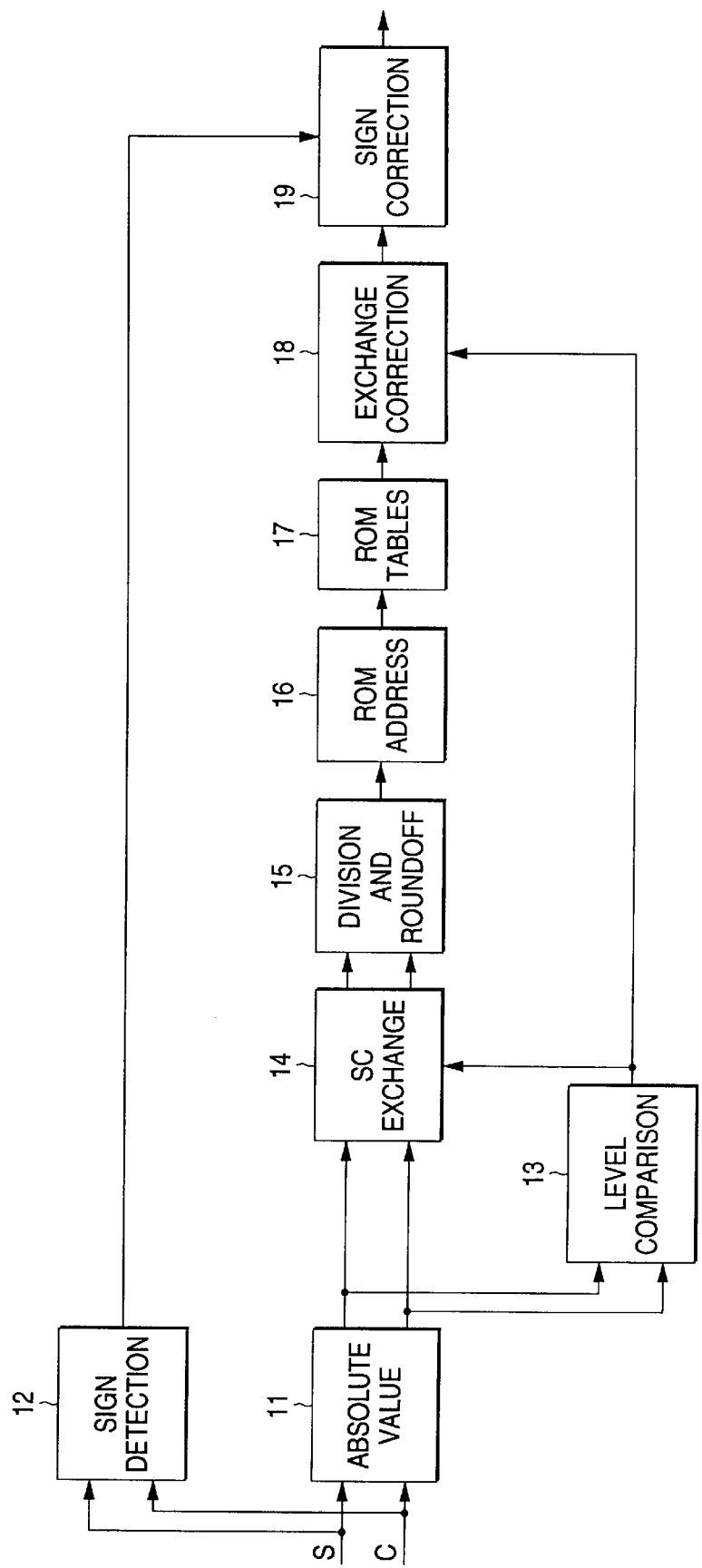
FIG. 3 is a diagram showing an example of an arctangent circuit in the invention.

Next, FIG. 3 shows an arctangent circuit in which the three techniques are employed. The arctangent circuit as shown in FIG. 3 is used in place of the arctangent circuit in the digital FM demodulation circuit of FIG. 1.

First, inputted S and C signals are inputted into an absolute value detection unit 11 and a sign detection unit 12. The first method is realized by the absolute value detection unit 11, the sign detection unit 12, and a sign correction unit 19. The absolute value detection unit 11 detects the absolute values of the input signals. Even when S/C is a negative value in the third quadrant of FIG. 2, S/C is processed as a positive value in the first quadrant, and a corresponding angle (arctangent) value is obtained from the ROM tables. On the other hand, the sign detection unit 12 detects the signs of the input signals. When S/C is a negative value, the sign correction unit 19 corrects the polarity of the obtained angle to be negative, so that the correct arctangent value is outputted. According to the above, the number of ROM tables 17 can be reduced.

The output of the absolute value detection unit 11 is input to a level comparison unit 13 and a SC exchange unit 14. The level comparison unit 13, the SC exchange unit 14, and an exchange correction unit 18 which corrects the phase value realize the second method. The level comparison unit 13 detects the level relationship between the input S and C signals. In the SC exchange unit 14, only when the detection result of the level comparison unit 13 indicates S/C>1, the values of S and C are exchanged with each other, and the exchanged values are then outputted. A ROM address unit 16 obtains an arctangent value corresponding to the exchanged value (C/S), from the ROM tables 17, and outputs the arctangent value.

Specifically, when the S/C is larger than 1, the S/C is processed as the S/C is exchanged with its inverse number C/S which is smaller than 1, and an angle (arctangent) corresponding to the inverse number from the ROM tables is obtained. The thus obtained value is corrected to the correct angle value on the basis of the expression (2) described in the second method. This process is performed by the exchange correction unit 18. When S/C is larger than 1, the angle correction process is implemented.

The signals which have passed through the SC exchange unit 14 are inputted to a division and roundoff unit 15. According to this configuration, the third method is realized. The division and roundoff unit 15 obtains S/C from the input S and C signals, and rounds off the obtained S/C to one of the typical values a0 to a7 which are uniformly divided as shown in the Table 4. For the typical values a0 to a7, arctangent values corresponding to the typical values are arranged in the ROM tables 17 with addresses. The ROM address unit 16 controls operations of reading out a corresponding arctangent value from the ROM tables 17 and outputting the read out arctangent value.

(Second embodiment)

The first embodiment described above is the most preferable embodiment which employs all the first to third methods so that the number of ROM tables can be reduced to a minimum level. Alternatively, an arctangent circuit which can prevent the S/N ratio from being degraded may be configured without employing the second method. In this case, a phase in the range of 0 to 90 degrees is used, and hence the graph of FIG. 2 cannot be equally divided in the direction of the S/C axis as described in the third technique. Therefore, there is studied typical values such as shown in Table 5 which are obtained on the basis of the typical values of Table 3.

TABLE 5

| S/C | (S/C) × 7 | Arctan(S/C) (degree) | Phase Difference from the previous phase (degree) |
|---|---|---|---|
| 0 | 0 | 0 | |
| 1/7 | 1 | 8.13 | 8.13 |
| 2/7 | 2 | 15.95 | 7.82 |
| 3/7 | 3 | 23.20 | 7.25 |
| 4/7 | 4 | 29.74 | 6.54 |
| 5/7 | 5 | 35.54 | 5.80 |
| 6/7 | 6 | 40.60 | 5.06 |
| 7/7 | 7 | 45.00 | 4.40 |

| S/C | 14−(C/S) × 7 | Arctan(S/C) (degree) | Phase Difference from the previous phase (degree) |
|---|---|---|---|
| 7/6 | 8 | 49.40 | 4.40 |
| 7/5 | 9 | 54.46 | 5.06 |
| 7/4 | 10 | 60.26 | 5.80 |
| 7/3 | 11 | 66.80 | 6.54 |
| 7/2 | 12 | 74.05 | 7.25 |
| 7/1 | 13 | 81.87 | 7.82 |
| 7/0 | 14 | 90.00 | 8.13 |

As shown in the column of "phase difference from the previous phase" of Table 5, the maximum value of "phase difference from the previous phase" is identical with that in the first embodiment. Even when an arctangent circuit is configured by using only these typical values, therefore, a large difference does not arise in the SN ratio of the detector output.

Figure 4:
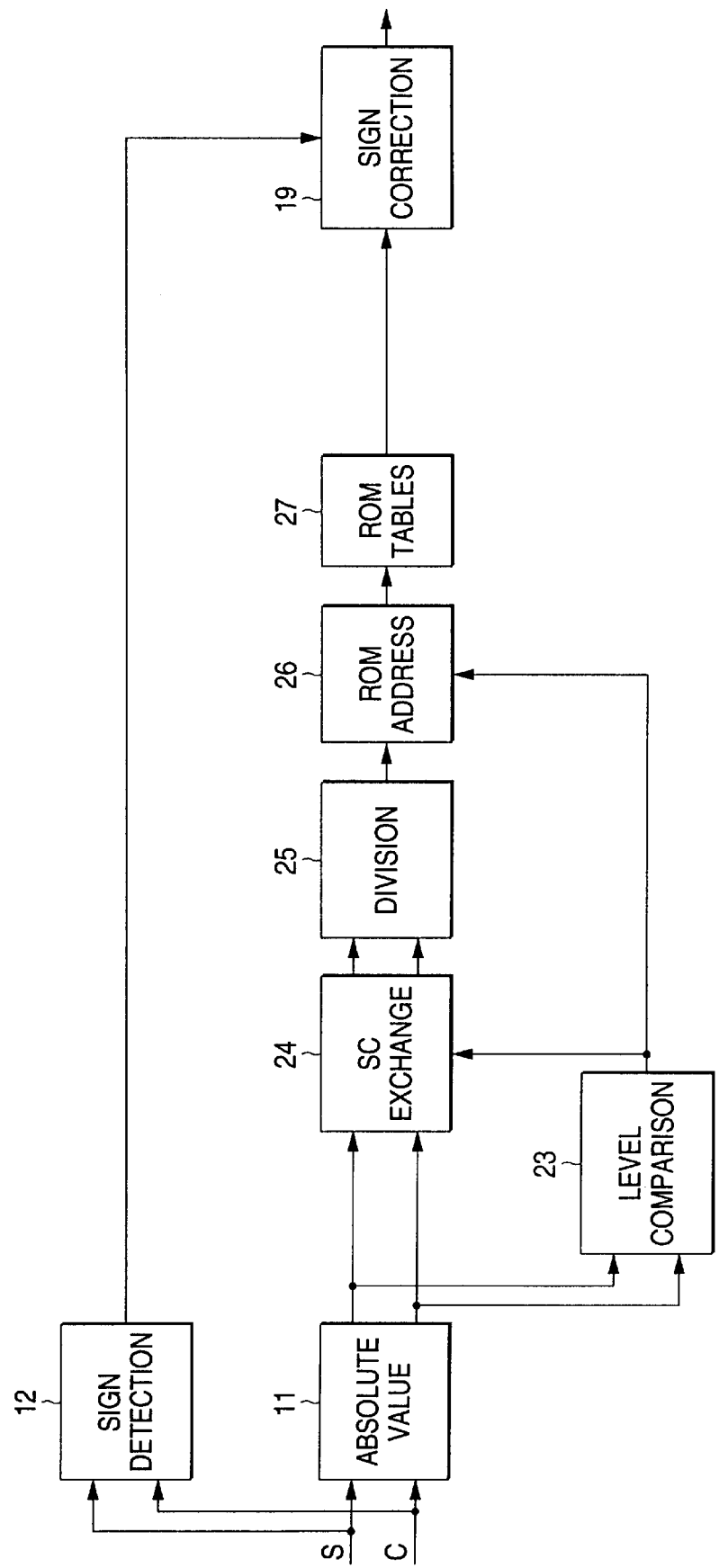
FIG. 4 is a diagram showing another example of an arctangent circuit in the invention.

FIG. 4 shows an arctangent circuit which uses such typical values. The same components as those of FIG. 3 are denoted by the same reference numerals, and their detailed description is omitted. In the second embodiment, the phase in the range of 0 to 90 degrees is used. In principle, the SC exchange unit 14 and the exchange correction unit 18 which are used in the first embodiment are therefore unnecessary. In the second embodiment, however, the ROM address is determined in the following manner, and hence an exchange of S and C is required.

In the second embodiment, the output of the absolute value detection unit 11 is supplied to the level comparison unit 23 and the SC exchange unit 24. The level comparison unit 23 detects the level relationship between the input S and C signals. Only when the detection result indicates S/C >1, the values of S and C are exchanged with each other. The outputted values of S and C are divided in a division unit 25, so that S/C is obtained (when S/C>1, the division is substantially performed as C/S). The division result is outputted.

In the case where S≦C (the arctangent is 0 to 45 degrees), a ROM address unit 26 multiplies S/C by 7. At this time, an integer being one of from 0 to 7 is obtained as an integer part, and hence also a process of rounding the multiplication value to an integer value is implemented. In the case of S>C (the arctangent of 45 to 90 degrees), C/S is multiplied by 7, and the multiplication result is subtracted from 14. At this time, an integer being one of from 8 to 14 is obtained as an integer part, and hence also a process of rounding the subtraction value to an integer value is similarly implemented. As a result of the above processes, an integer one of from 0 to 14 is derived.

ROM tables 27 hold arctangent values in one-to-one correspondence with such integers. A ROM address corresponding to the integer value obtained as a result of the above calculation is acquired in the ROM address unit 26. An arctangent value designated by the address is read out from the ROM tables 27, and then outputted.

In the second embodiment, although the number of the ROM tables is twice that in the first embodiment, the angle correction process which is performed in the first embodiment is not required. Furthermore, there appears no difference in S/N ratio of the demodulation output. Therefore, it is preferable to employ either of the embodiments in accordance with necessity.

As described above, according to the invention, the number of ROM tables can be reduced while preventing the SN ratio from being impaired.

What is claimed is:

1. A digital FM demodulation circuit sampling an input analog FM signal and digitally detecting the sampled input signal, said circuit comprising:

an arctangent circuit into which a second signal that is delayed from the sampled input signal for a constant time and a third signal that is different in phase at 90 degrees from the second signal are inputted, and which outputs a corresponding arctangent value based on a result of a division of the two input signals, and said arctangent circuit including:
roundoff means for sequentially rounding the division result to one of a plurality of typical values;
ROM address unit for selecting an arctangent value corresponding to the rounded typical value from a ROM table containing typical arctangent values, and outputting the selected arctangent value;
polarity detection means for detecting whether the division result is a negative value; and
a polarity correction unit which changes a polarity of the outputted arctangent value, and
wherein if said polarity detection unit judges that the division result is a negative value, said polarity correction unit changes the polarity of the output arctangent value to negative.

2. A digital FM demodulation circuit sampling an input analog FM signal and digitally detecting the sampled input signal, said circuit comprising:

an arctangent circuit into which a second signal that is delayed from the sampled input signal for a constant time and a third signal that is different in phase at 90 degrees from the second signal are inputted, and which outputs a corresponding arctangent value based on a result of a division of the two input signals, and said arctangent circuit including:
roundoff means for sequentially rounding the division result to one of a plurality of typical values;
ROM address unit for selecting an arctangent value corresponding to the rounded typical value from a ROM table containing typical arctangent values, and outputting the selected arctangent value;
a level comparison unit comparing a level of the second signal with a level of the third signal;
an exchange unit exchanging the second signal with the third signal; and
a correction unit correcting the selected arctangent value and providing a corrected arctangent value,
wherein if said level comparison unit judges that the second signal is larger in level than the third signal, said exchange unit exchanges the second signal with the third signal, and selects a corresponding arctangent value from said ROM table based on the exchanged value, and said correction unit corrects the selected arctangent value outputted from said ROM table to the corrected arctangent value to be obtained in the case where the second signal is not exchanged with the third signal.

3. The digital FM demodulation circuit according to claim 1, wherein values in the plurality of typical values are evenly distributed within a predetermined range.

* * * * *